(12) United States Patent
U-Yen et al.

(10) Patent No.: US 10,483,610 B2
(45) Date of Patent: Nov. 19, 2019

(54) WAVEGUIDE MOUNT FOR MICROSTRIP CIRCUIT AND MATERIAL CHARACTERIZATION

(71) Applicant: United States of America as represented by the Administrator of NASA, Washington, DC (US)

(72) Inventors: Kongpop U-Yen, Arlington, VA (US); Edward J. Wollack, Clarksville, MD (US); Ari D. Brown, Ellicot City, MD (US)

(73) Assignee: United States of America as represented by the Administrator of NASA, Washington, DC (US)

( * ) Notice: Subject to any disclaimer, the term of this patent is extended or adjusted under 35 U.S.C. 154(b) by 79 days.

(21) Appl. No.: 15/684,215

(22) Filed: Aug. 23, 2017

(65) Prior Publication Data

US 2019/0067779 A1 Feb. 28, 2019

(51) Int. Cl.
| | | |
|---|---|---|
| *H01P 5/08* | (2006.01) | |
| *H01P 3/08* | (2006.01) | |
| *H01L 23/13* | (2006.01) | |
| *H01L 23/66* | (2006.01) | |
| *H01P 5/107* | (2006.01) | |
| *H01P 5/02* | (2006.01) | |
| *H01P 1/203* | (2006.01) | |
| *H01P 1/17* | (2006.01) | |

(52) U.S. Cl.
CPC .............. *H01P 5/087* (2013.01); *H01L 23/13* (2013.01); *H01L 23/66* (2013.01); *H01P 1/2039* (2013.01); *H01P 3/08* (2013.01); *H01P 5/028* (2013.01); *H01P 5/107* (2013.01); *H01P 1/173* (2013.01)

(58) Field of Classification Search
CPC .................... H01P 3/08–088; H01P 5/08–107
See application file for complete search history.

(56) References Cited

U.S. PATENT DOCUMENTS

| | | | | |
|---|---|---|---|---|
| 5,496,797 | A * | 3/1996 | Higaki | H01L 39/143 257/E39.018 |
| 5,908,811 | A * | 6/1999 | Das | H01P 1/20336 333/205 |
| 9,614,270 | B2 * | 4/2017 | Chang | H01P 7/06 |
| 9,742,052 | B2 * | 8/2017 | Hasch | H01P 5/107 |
| 9,893,262 | B2 * | 2/2018 | Thompson | H01P 1/2013 |
| 10,134,972 | B2 * | 11/2018 | Oliver | H01L 25/0657 |
| 10,145,743 | B2 * | 12/2018 | Timofeev | G01J 5/024 |

* cited by examiner

*Primary Examiner* — Dean O Takaoka
*Assistant Examiner* — Alan Wong
(74) *Attorney, Agent, or Firm* — Christopher O. Edwards; Bryan A. Geurts

(57) ABSTRACT

The present invention relates to a waveguide-to-microstrip line transition package for superconducting film characterization. The package allows propagation and impedance properties thin-film microwave line superconductor to be characterized at millimeter wave frequencies as a function of frequency. The superconducting film's kinetic inductance can be varied by applying direct current along the ground plane via spring loaded probe. When implemented with a non-superconducting metal housing the present invention is highly suitable for measuring resonators with the quality factor, Q, ranges from 100 to $1\times10^4$. Through the use of a housing realized from an appropriate superconducting bulk material or coating the upper end of this range of applicability can be readily extended to $>1\times10^6$.

17 Claims, 5 Drawing Sheets

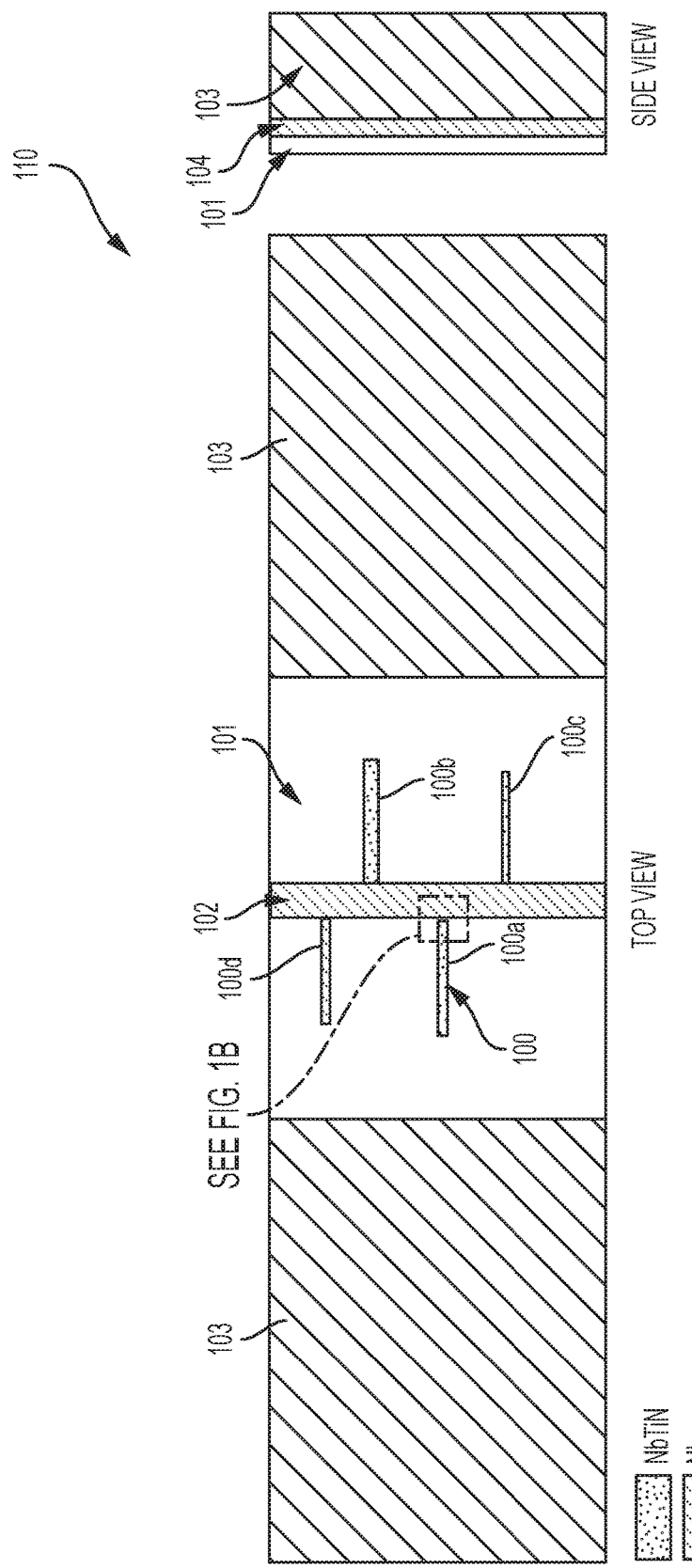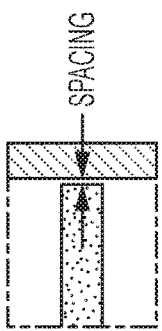

WAVEGUIDE MOUNT FOR MICROSTRIP CIRCUIT AND MATERIAL CHARACTERIZATION

ORIGIN OF THE INVENTION

The invention described herein was made by an employee of the United States Government, and may be manufactured or used by or for the Government for governmental purposes without the payment of any royalties thereon or therefor.

BACKGROUND OF THE INVENTION

1. Field of the Invention

The present invention relates to the characterization of a microstrip superconducting film at millimeter-wave frequencies on a thin film dielectric, and which avoids the complex thin film fabrication process.

In particular, the present invention relates to a waveguide-to-microstrip line transition package for characterization of a superconducting thin-film. The package allows the effective surface impedance, Z, and propagation constant, γ, (or equivalently the effective permittivity, ε, and permeability, μ) of transmission line structures to be accurately measured at millimeter wave frequencies as a function of temperature. The superconducting film's kinetic inductance used in the microstrip line can be changed with a direct current (DC) injected into the ground plane via a spring-loaded probe. When implemented with a non-superconducting metal housing (e.g., copper), the present invention is highly suitable for measuring resonators with the quality factor, Q, ranges from 100 to $1\times10^4$. Through the use of a housing realized from an appropriate superconducting bulk material or coating (i.e., with a transition temperature or gap frequency higher than the sample of interest), the upper end of this range of applicability can be readily extended to $>1\times10^6$.

2. Description of the Related Art

The performance of cryogenic microwave circuits and systems have been significantly advanced through the use of low-loss dielectric and superconducting thin film materials. In implementing the use of these materials, the propagation and impedance properties must be known at the system's operating frequency and temperature in order to predict, design, and achieve the desired circuit response.

A variety of techniques have been used to study the properties of thin-films at cryogenic temperatures. However, many are best suited for exploring the DC and low frequency responses. At far infrared wavelengths, the material properties of homogenous superconducting thin-films have traditionally been explored via Fourier Transform Spectroscopy (FTS), and in more complex circuit settings, when augmented with de-embedding techniques relying on an explicit knowledge of the device geometry.

Cryogenic device characterization at microwave frequencies commonly relies on a combination of antenna-coupled test structures combined with on-chip detection. Metrology approaches based on these techniques generally simplifies the readout complexity; however, it increases the wafer fabrication overhead, the required device size, and the challenge of extracting high precision material parameters.

Further, prior art techniques utilized antenna-coupled bolometers as part of the superconducting film structure through the thin-film deposition process. However, there are several disadvantages or limitations of the prior art, including: a) it is more complex to fabricate superconducting film with embedded detectors; b) it requires various on-chip millimeter wave components to support detection, biasing, and signal readout required to carry out the desired measurement, leading to a more complex package assembly and testing efforts; c) characterizing the superconducting film requires a custom electronic equipment and setup; and d) the resolution of the measurement is dependent on the sensitivity and calibration accuracy of the detector and can vary among various fabrication runs and processes.

Accordingly, a waveguide-to-microstrip line transition package for superconducting film characterization utilizing existing microwave metrology assets operating at room temperature, is highly desirable to minimize sample fabrication and measurement complexity while improving parameter measurement accuracy, at a significantly lower effort (fabrication and test costs) than having a device fabricated on, for example, a test sample.

SUMMARY OF THE INVENTION

The present invention relates to a waveguide-to-microstrip line transition package for superconducting film characterization. The package of the present invention allows the effective surface impedance, Z, and propagation constant, γ, (or equivalently the effective permittivity, ε, and permeability, μ) of transmission line structures to be accurately measured at millimeter wave frequencies as a function of temperature. The superconducting film's kinetic inductance used in the microstrip line can be changed with a direct current (DC) injected into the ground plane via a spring-loaded probe. When implemented with a non-superconducting metal housing (e.g., copper), the present invention is highly suitable for measuring resonators with the quality factor, Q, ranges from 100 to $1\times10^4$. Through the use of a housing realized from an appropriate superconducting bulk material or coating (i.e., with a transition temperature greater than the sample of interest), the upper end of this range of applicability can be readily extended to $>1\times10^6$.

Specifically, in one embodiment, the present invention discloses a superconducting film, which is characterized at millimeter (mm) wavelengths using a reusable waveguide mount configuration in the form of an E-plane waveguide split-block test fixture. In one embodiment, the test fixture is realized from a pair of mode converters, which transition from rectangular waveguide to on-chip microstrip-line signal propagation via a stepped ridge-guide impedance transformer. The observed performance in a W-band package (WR10.0; broadwall width, $a_o$=0.100" and guide height, $b_o$ 0.050") at 4.2 K has a maximum in-band transmission ripple of 2 dB between 1.53 and 1.89 times the waveguide cutoff frequency. The fixture design of the present invention may be used in other standard ($a_o$:$b_o$=2.000:1) rectangular waveguide bands by appropriately scaling the dimensions outlined. Accordingly, with minor modification to the septum geometry by a suitably skilled individual, other non-standard waveguide configurations or embodiments, can be readily realized.

The present invention enables an appropriately prepared test device to be repeatedly positioned and precisely aligned with respect to metrology details incorporated in the waveguide fixture. The response of the superconducting microstrip sample can be calibrated and measured at cryogenic temperatures using standard vector network analyzer and mm-wave extension module waveguide interfaces if required in the desired spectral band. Alternatively, a suitable source and receiver in waveguide can be used. This metrology approach enables the characterization of superconducting microstrip test structures as a function of temperature and frequency.

The present invention provides natural extensions to the characterization of higher quality factor samples through the use of a superconductor for housing material, the scaling of rectangular waveguide to other standard 2.000:1 bands, and a non-standard band by changing septum geometry; thus, other non-standard waveguide configurations or embodiments, can be readily realized.

Similarly, one could readily substitute CPW (co-planar waveguide) for microstrip on the test structure, if the properties of this transmission line media (or other) where desired though the use of an appropriate on chip transition.

The present invention relates to a superconducting film device including: a superconducting microstrip device including: a single-crystal silicon substrate deposited on a silicon handling wafer; a niobium (Nb) microstrip feed line; and a plurality of niobium titanium nitride (NbTiN) superconducting microstrip resonators and a niobium (Nb) half-wavelength resonator, deposited on said silicon substrate and coupled to said microstrip feed line.

In one embodiment, the silicon substrate is 50 μm in thickness.

In one embodiment, the NbTiN microstrip resonators are 80, 40, and 20 μm in width, and respectively 550, 534 and 510 μm in length.

In one embodiment, the Nb resonator is 20 μm in width and 510 μm in length.

In one embodiment, the silicon handling wafer has a thickness of 325 μm, a length of 6 mm, and a width of 1.5 mm.

In one embodiment, the NbTiN microstrip resonators and said Nb resonator, are each disposed 8 μm away from the Nb microstrip feed line.

In one embodiment, a waveguide-to-microstrip line transition package for superconducting film characterization, includes: a superconducting microstrip device described above; and a fixture in which the microstrip device is disposed.

In one embodiment, the fixture includes: a plurality of blocks which form a waveguide housing, and which are used to align and secure the silicon handling wafer of the microstrip device to the fixture; a waveguide septum made from a sheet; and a plurality of direct current (DC) probes disposed adjacent to the waveguide septum, and which contact the microstrip device to provide at least DC bias.

In one embodiment, a thickness of the waveguide septum is 100 μm, and the waveguide septum is formed from gold-plated beryllium-copper (BeCu).

In one embodiment, the plurality of blocks is formed from copper, and the fixture further includes: a photonic choke milled onto a wall of the waveguide housing around and flanking the waveguide septum, and which defines a repeatable minimal-loss interface with high field confinement.

In one embodiment, the package further includes: a spring disposed under the microstrip device, which presses the microstrip device against the waveguide septum.

In one embodiment, the package further includes: a waveguide structure which accommodates two waveguides, each of the waveguides which are disposed in a port of the waveguide structure; wherein each port transmits and receives millimeter wave power into and out of the microstrip device contained in the fixture.

In one embodiment, the waveguide structure includes a plurality of stages, including a plurality of ridge-guides which convert the waveguide from a relatively larger width to a relatively smaller width, ending at the microstrip device; and wherein the plurality of ridge-guides are implemented as the waveguide septum in the fixture.

In one embodiment, the septum is 100 μm in width, and a 26Ω characteristic impedance microstrip line width is 150 μm, allowing placement of the waveguide septum within a +/−25 μm alignment tolerance.

In one embodiment, a ground plane of said microstrip device is realized from 0.5 μm thick niobium (Nb).

In one embodiment, transmission of the package, as well as loss, is evaluated in the superconducting film through a quality factor (Q) measurement.

In one embodiment, the waveguides are formed of at least one of stainless steel or copper.

In one embodiment, the package further includes: a cryogenic test apparatus in which the fixture and the waveguides are disposed, the test apparatus including: a dewar containing a reservoir of liquid helium; a shield which surrounds the micro strip device disposed in the fixture; wherein the microstrip device in the fixture is connected to the liquid helium by a heat strap; a helium gas purge line, which purges helium gas from the fixture; a vacuum window, which seals room temperature ends of the waveguides; wherein said ends of the waveguides are connected to millimeter wave extension modules via 10 dB couplers and 10 dB attenuators; and a heater which prevents cooling of the vacuum window below the dew point of the ambient atmosphere.

In one embodiment, the microstrip device is operated between 90 and 100 GHz, is used to measure quality factor, and extract complex propagation properties to an accuracy of a few parts per thousand.

In one embodiment, the fixture is operated with a temperature range of from sub-kelvin to 320 K.

Thus, has been outlined, some features consistent with the present invention in order that the detailed description thereof that follows may be better understood, and in order that the present contribution to the art may be better appreciated. There are, of course, additional features consistent with the present invention that will be described below and which will form the subject matter of the claims appended hereto.

In this respect, before explaining at least one embodiment consistent with the present invention in detail, it is to be understood that the invention is not limited in its application to the details of construction and to the arrangements of the components set forth in the following description or illustrated in the drawings. Methods and apparatuses consistent with the present invention are capable of other embodiments and of being practiced and carried out in various ways. Also, it is to be understood that the phraseology and terminology employed herein, as well as the abstract included below, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the methods and apparatuses consistent with the present invention.

BRIEF DESCRIPTION OF THE DRAWINGS

FIG. 1A shows the device under test, which contains Nb and NbTiN microstrip resonators on a 50 μm thick single-crystal silicon (Si) substrate, according to one embodiment consistent with the present invention.

FIG. 1B shows an enlarged view of the spacing between a NbTiN microstrip resonator and the microstrip feed line of the device of FIG. 1A.

FIG. 2A shows the test fixture with gold-plated copper septum and DC probes, and FIG. 2B shows the test fixture viewed from the bottom. FIG. 2C shows the top-half of the text fixture, which contains waveguide channel and photonic choke. FIG. 2D shows the bottom-half of the package, which contains chip alignment features.

DESCRIPTION OF THE INVENTION

Figure 2A:
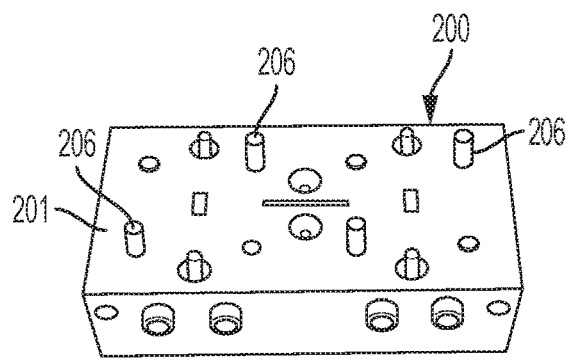
FIGS. 2A-2D show the test fixture used for characterizing thin-film superconductor microstrip resonators, according to one embodiment consistent with the present invention.
Figure 2B:
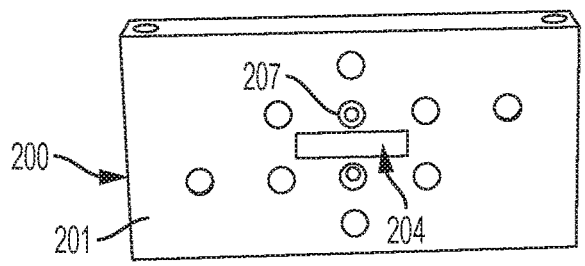
Figure 2C:
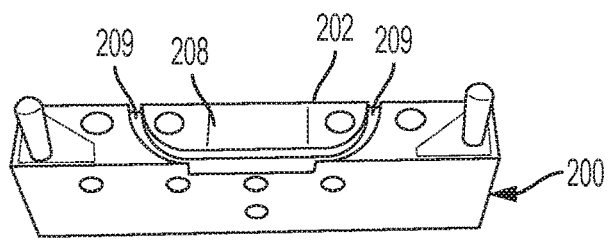
Figure 2D:
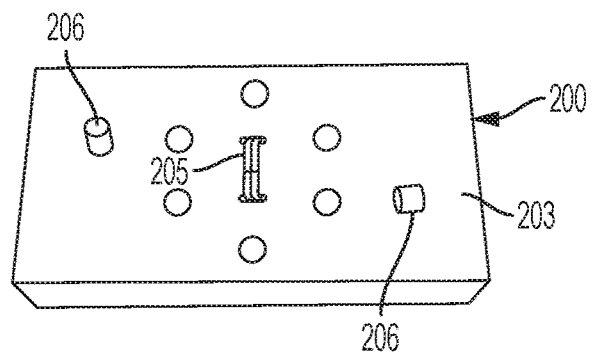

The present invention relates to a waveguide-to-microstrip line transition package for superconducting film characterization. The package of the present invention allows the effective surface impedance, Z, and propagation constant, $\gamma$, (or equivalently the effective permittivity, $\varepsilon$, and permeability, $\mu$) of transmission line structures to be accurately measured at millimeter wave frequencies as a function of temperature. The superconducting film's kinetic inductance used in the microstrip line can be changed with a direct current (DC) injected into the ground plane via a spring-loaded probe. When implemented with a non-superconducting metal housing (e.g., copper), the present invention is highly suitable for measuring resonators with the quality factor, Q, ranges from 100 to $1\times10^4$. Through the use of a housing realized from an appropriate superconducting bulk material or coating (i.e., with a transition temperature greater than the sample of interest), the upper end of this range of applicability can be readily extended to $>1\times10^6$.

In one embodiment, the present invention includes a superconducting film device 110 having a plurality of niobium titanium nitride (NbTiN) microstrip line resonators 100 (see FIG. 1) that can be used to measure the effective surface impedance, Z, and propagation constant, $\gamma$, (or equivalently the effective permittivity, $\varepsilon$, and permeability, $\mu$) at various frequencies. In one exemplary embodiment, the device of the present invention under test includes a plurality of microstrip line resonators 100, such as three NbTiN resonators 100a, 100b, 100c, and one niobium (Nb) half-wavelength resonator 100d, disposed on a, for example, 50 µm thick, single-crystal silicon substrate 101 (301 in FIG. 3), and coupled to a Nb microstrip feed line 102.

In one exemplary embodiment, the silicon substrate 101 is disposed on a low-resistivity silicon handling wafer 103 (303 in FIG. 3), having measurements of 1.5 mm in width, 6 mm in length, and 50 µm in thickness.

In one exemplary embodiment, the test chip ground plane is realized from 0.5 µm thick Nb 104.

In one exemplary embodiment, the NbTiN resonators' 100a-100c microstrip line widths, are 80, 40 and 20 µm, respectively, and the lengths are 550, 534, 510 µm, respectively.

In one exemplary embodiment, the Nb resonator 100d is 20 µm wide and 510 µm long.

In one exemplary embodiment, the resonators 100a-100d are placed 8 µm away from the superconducting Nb feed line 102 (whose characteristic impedance is 26 ohms), to define the microstrip resonator coupling. In one exemplary embodiment, the microstrip feed line 102 has a width of 150 µm.

In one exemplary embodiment, the package transmission, as well as loss, is evaluated in the superconducting film through a quality factor (Q) measurement.

In one exemplary embodiment, the present invention includes a fixture 200 (see FIGS. 2A-2D), which is used for characterizing the thin-film superconductor microstrip resonators 100. In one exemplary embodiment, the fixture 200 includes an E-plane split-block package 200 made from three block pieces 201, 202, 203 by direct computer numerical control (CNC) machining. In one exemplary embodiment, the blocks 201-203 are made of copper.

In one exemplary embodiment, direct current (DC) probes 207 (307 in FIG. 3) are disposed adjacent to a waveguide septum 304 (see FIG. 3) (disposed at location 204 in FIG. 2B), when viewed from the bottom of the fixture. The top-half of the fixture 200 contains the waveguide channel 209 (302 in FIG. 3) and photonic choke 313 (disposed at location 208) (see FIG. 2C).

In one exemplary embodiment, the waveguide septum 304 (see FIG. 2B and FIG. 3) is realized from a gold-plated 100-µm thick beryllium-copper (BeCu) sheet fabricated using photo-chemical etching. In one exemplary embodiment, the photonic choke 313 joint is milled onto the wall 208 of the split-block copper housing 200 around the septum sheet 304, to define a minimal loss interface.

In one exemplary embodiment, two of the block pieces 201, 202 form the waveguide housing 200, while the third block piece 203 is used to align and secure the microstrip test wafer 205 in the fixture 200. Alignment pins 206 in the copper blocks 200-203 are used to facilitate device 200 assembly. The outer surfaces of the split-block housing 200 are used as a reference to align the package elements before tightening the fixture 200 using housing fasteners.

Generally, waveguide is one of the most commonly used media in distributing single-mode mm-wave signals. Its low-loss properties, ease of fabrication, and rigid mechanical construction enables its use as a precision guiding media over a wide range of operating conditions when used in conjunction with appropriate thermal isolation structures. To apply these measurement capabilities to the characterization of superconducting thin-film planar circuits, an appropriate low-loss mode-converter between waveguide 300 and planar device structures is desired. This transition can be performed using either non-physically-contacting or via electrically contacting interfaces.

In a non-contacting interface, a portion of the sample area is dedicated for use as a radiating element. In addition, this technique requires relatively precise alignment between the coupling element and test sample, which can complicate fitting this structure within the waveguide cross-section and achievable resonance free bandwidth achievable. To enable efficient coupling, many prior art approaches resorted to multiple metallization layers in the device structure, which increases the test sample's overall fabrication complexity. On the other hand, an interface with physical film contact can be achieved through the use of a waveguide-planar transmission line mode converter. This choice largely moves the complexity of the transition design to the waveguide housing, and thus, in principle, reduces the sample fabrication overhead.

Figure 3:
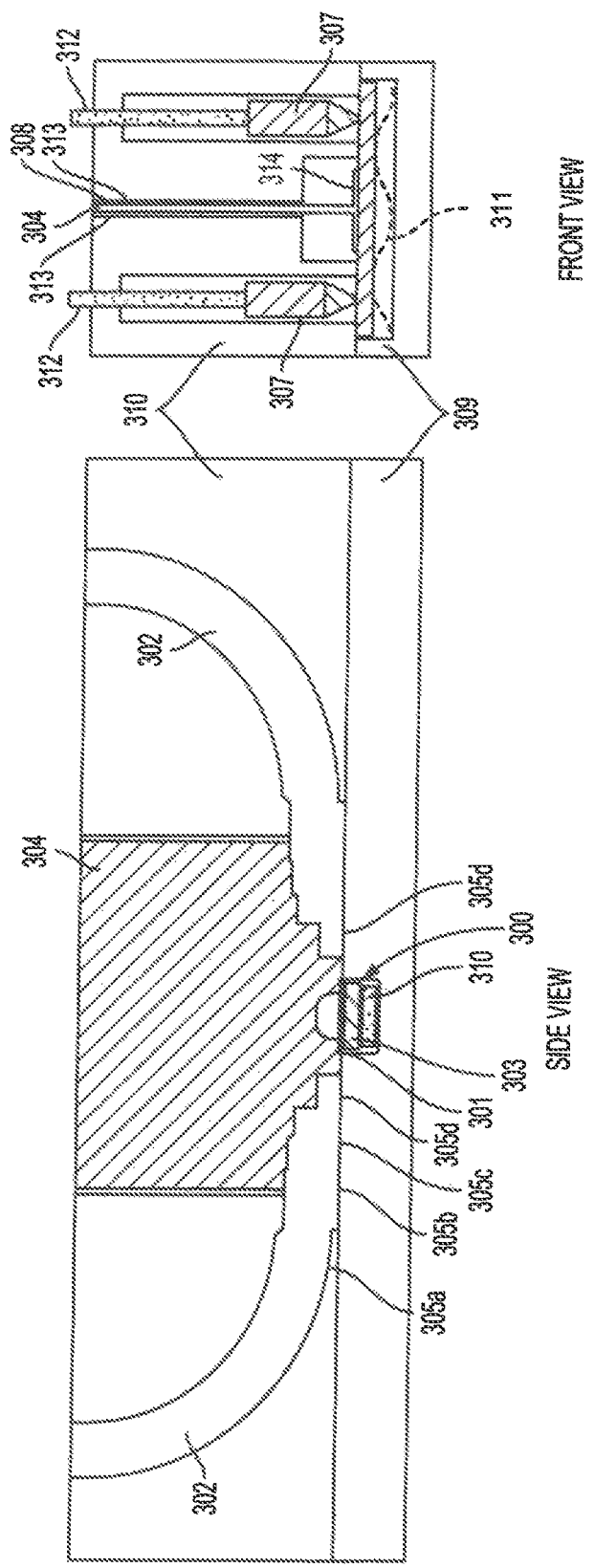
FIG. 3 shows the detail of the experimental set up used for superconducting circuit characterization at W-band frequencies, connected to a vector network analyzer, according to one embodiment consistent with the present invention.

In one exemplary embodiment, a waveguide-to-microstrip transition is employed for the thin-film circuit and material characterization, as shown in FIG. 3. In one exemplary embodiment, the present invention includes a two-port waveguide 302 structure. The ports are used to transmit and receive the millimeter wave power into and out of the superconducting film device 110 disposed in the test fixture 300.

In one exemplary embodiment, a four-stage ridge-guide 305a-305c is used to convert from the WR10.0 waveguide 302 (disposed in top conductor block 310) to the microstrip line on a silicon substrate 301 disposed on silicon wafer 303, for test samples 110 disposed in test fixture 300. The ridge-guide sections 305a-305c are implemented in septum 304 in the E-plane split-block housing 300 (disposed in bottom conductor block 309), and are designed to provide efficient mode-conversion, a controlled impedance transformation, and physical contact to the microstrip line pads on the test structure 300.

In one exemplary embodiment, the test fixture 300 is pressed against the waveguide septum 304 and with a physical contact force by a spring 311 residing under the microstrip device 300. In an exemplary embodiment, the spring is made of BeCu. Features machined into the split-block housing 300 define the chip 110 alignment in the waveguide 302 with respect to the package housing 300.

In an exemplary embodiment of the present invention, a waveguide septum 304 transforms the rectangular waveguide 302 mode and reduces the waveguide 302 height to the same thickness as the silicon substrate 301 as shown in FIG. 3.

In one exemplary embodiment, the width of the waveguide septum 304 determines the contact area size as it is placed on top of the metal trace 314 on the 50 μm-thick single-crystal silicon substrate 301. In one exemplary embodiment, the septum 304 is 100 μm wide and the 26Ω characteristic impedance micro strip line width is 150 μm, allowing the septum 304 placement within a +/−25 μm alignment tolerance.

In one exemplary embodiment, photonic choke joints 308 flank the septum 304. In one exemplary embodiment, DC spring contact probes 307 connected to insulated wires 312 (made of stainless steel, for example), contact the microstrip device to provide DC bias or facilitate other on-chip characterization needs.

For a broadband spectral response, the microstrip line's dielectric should be as thick as possible to maximize the microstrip pad contact area while maintaining single-mode transmission in the waveguide 302 band. On the other hand, to limit the radiation loss from the microstrip structure 300, dielectric thickness should be small relative to the operating wavelength, in order to minimize spurious electromagnetic coupling to the waveguide walls 302 or septum 304.

Figure 4:
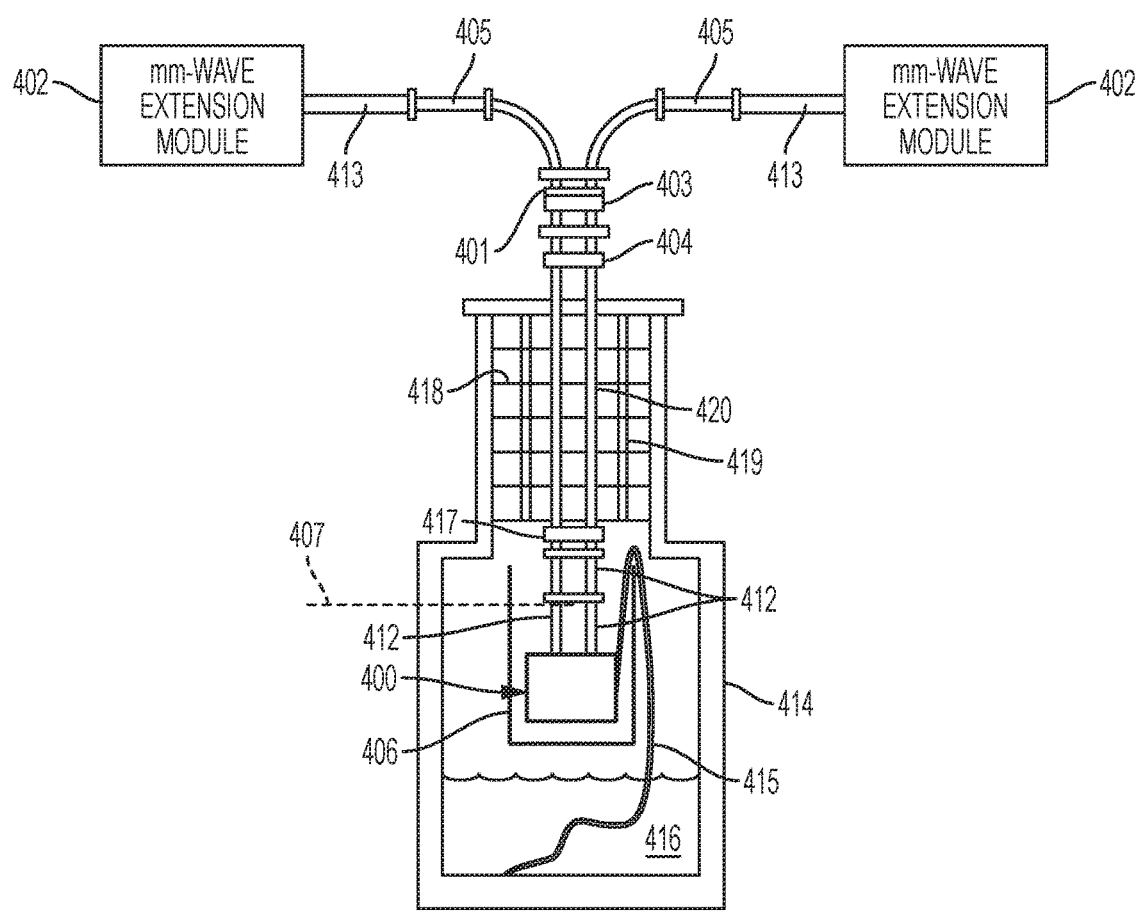
FIG. 4 shows a cross-sectional view of the waveguide-to-microstrip transition employed for thin-film circuit and material characterization, according to one embodiment consistent to the present invention.

Various methods can be used to test the package cryogenically. One method utilizes a closed cycle refrigeration system, another uses a liquid flow cryostat, alternatively, a dewar may be used with appropriate control over cryogens in the system. In one exemplary embodiment, as shown in FIG. 4, to cryogenically test the package 400, a section of thin-walled (for example, 250 μm in thickness), stainless steel waveguide 412 was utilized as a thermal break. The waveguide 412 transition to copper waveguide 420 as they become farther removed from the test fixture 400, to lower the millimeter wave loss.

In one exemplary embodiment, the room temperature ends of the waveguide 412 are sealed by a 12 μm thick vacuum membrane or window 401, and the waveguide ends 412 were connected to the WR-10 mm-wave extension modules 402 and a vector network analyzer (VNA; not shown), via 10 dB attenuators 405 and 10 dB couplers 413. The network analyzer is used to transmit and receive millimeter wave power into the package 400 and interrogate the system at room temperature.

In one exemplary embodiment, a cryogenic refrigeration unit is used for cold temperature operation.

In one embodiment, a copper heat strap 415 allows connection between the test device 400 and the liquid helium 416 in the tank 414.

In an exemplary embodiment, helium gas is used to purge excess air via helium gas purge line 403 from the package 400 and the waveguide 412 sections in cooling the device 400 in the cryostat to 4.2 K. In an exemplary embodiment, a heater 404 is used near the vacuum window 401 interface to prevent cooling below the dew point and accumulation of condensates at this interface. Thermometry is provided by a calibrated diode (calibration reference plane at location 407) attached to the test fixture 400.

In one exemplary embodiment, a heater 417 and heat shield baffles 418 allow the gas flowing through to be thermally stable. In one exemplary embodiment, stainless steel spacers 419 provide thermal breaks in tank 414.

In one exemplary embodiment, the 10 dB fixed attenuators 405 are used to limit reflections and present an appropriate power level for the package device 400. The test system was calibrated at room temperature using custom-made Thru-Reflect-Line (TRL) calibration standards at the fixture's 400 input interface 401. The packaged device 400 was enclosed in a magnetic shield 406 to suppress interactions between the Earth's magnetic field and the superconducting test device 400.

In one exemplary embodiment, the present invention is designed to operate between 90 and 100 GHz, although the design can be scaled to operate at other frequencies. It can be used to measure quality factor and extract the complex propagation properties to an accuracy of a few parts per thousand.

The device can be operated with temperature ranges from sub-kelvin to 320 K.

In one exemplary embodiment, the configuration's electromagnetic performance was simulated using an appropriate 3D finite-element electromagnetic simulation software. In one exemplary embodiment, an eigenmode analysis was used to evaluate the losses arising from various elements in the mount structure 200. In one exemplary embodiment, the copper package 200 walls limit the quality factor, $Q=2.1\times 10^4$, assuming a bulk resistivity of 1.68 μΩ-cm and a residual resistance ratio, RRR=10. For ohmic losses, to lowest order, Q scales as the square root of RRR for a normal metal. Similarly, the maximum quality factor achievable in the package, $Q_m$, is limited to $7.0\times 10^3$ in the operating band between 80 and 100 GHz due to the proximity of the finite resistivity copper septum 304. The simulated S-parameter frequency response for the transition is shown in FIG. 3.

Figure 5:
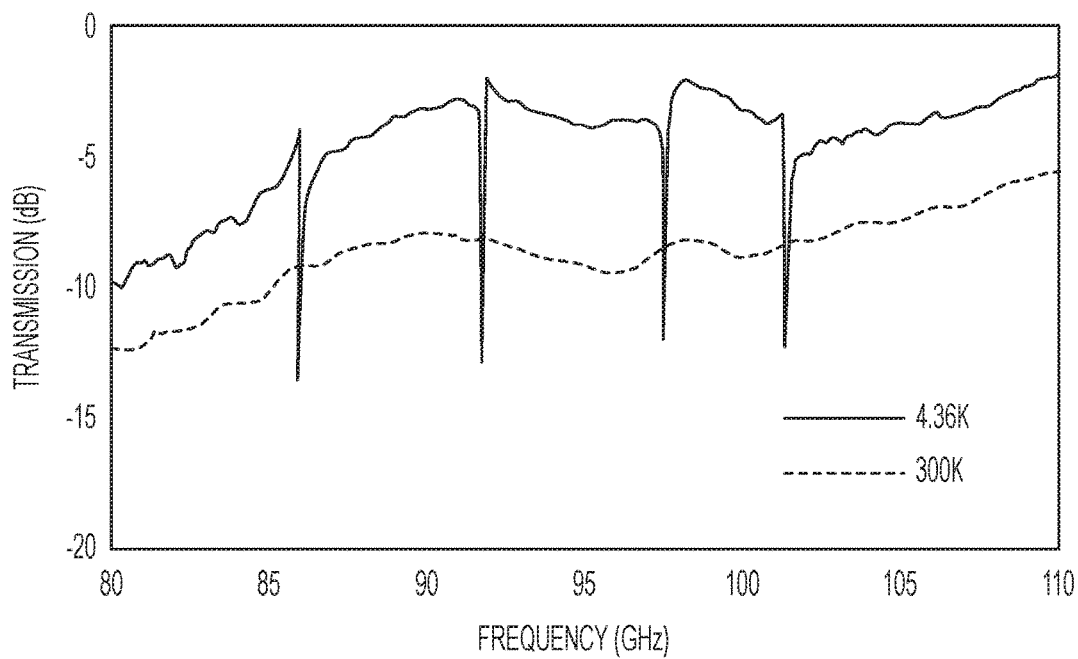
FIG. 5 shows a graph of measured Nb microstrip line resonators transmission response at 300 K and at 4.36 K using the waveguide-microstrip package, according to one embodiment consistent with the present invention.

The measurement results of FIG. 5 show relatively uniform transmission between 90 GHz and 110 GHz. FIG. 5 shows a graph of measured Nb microstrip line resonators transmission response at 300 K and at 4.36 K using the waveguide-microstrip package, according to one embodiment consistent with the present invention. The data are un-corrected for the 33 mm length of WR10.0 stainless steel waveguide after the VNA calibration reference plane and the temperature change of the guide structures upon cooling from ambient.

In one exemplary embodiment, the Nb resonator was designed to have the highest resonator frequency in the operating band, and was used to determine the dielectric loss of the substrate 101 through the measurement of its quality factor and serves as a reference for the NbTiN resonators 100a-100d to determine the kinetic inductance. The kinetic inductance can be extracted by comparing the measured resonance frequency with that simulated using with surface impedance model on the trace and ground plane and using an appropriate electromagnetic simulation program software or transmission line mode of the device structure.

The simulations indicate kinetic inductance values of ~0.81 pH/square and ~0.097 pH/square for NbTiN and Nb films, respectively, at 4.36K. These values are in agreement with the analytical model for NbTiN derived from numerical integration of the Mattis-Bardeen integrals computed based on the measured sheet thickness of 150 nm, critical temperature of 15K, and normal-state sheet resistivity of 79.4µΩ-cm.

Figure 6A:
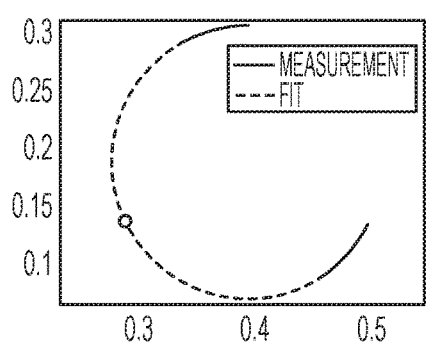
FIGS. 6A and 6B are graphs which show complex scattering parameters amplitude, S21, (6A—left) and power transmission (6B—right) which are measured and fit at a resonator physical temperature of 4.5 K, according to one embodiment consistent with the present invention.
Figure 6B:
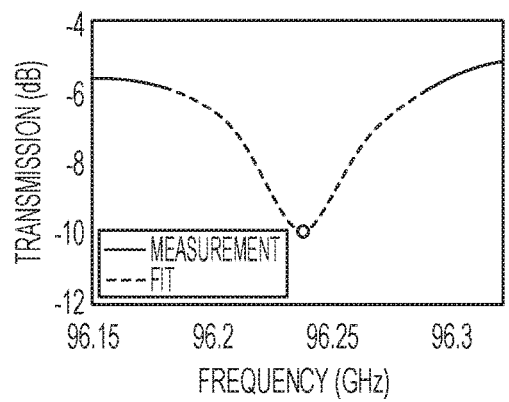

In one exemplary embodiment, the resonator parameters such as total quality factor ($Q_t$), coupling quality factor ($Q_c$), intrinsic quality factor ($Q_i$), and center resonance frequency ($f_0$) were extracted using a fit to the measured complex transmission $S_{21}$ (see FIGS. 6A-6B).

In one exemplary embodiment, FIGS. 6A-6B show the resulting model fit for one of the Nb resonators measured at 4.5 K. In particular, complex scattering parameter amplitude $S_{21}$ (FIG. 6A) and power transmission (FIG. 6B) are measured and fit at a resonator physical temperature of 4.5° K. The model fit accounts for rotation effects due to impedance mismatch of the feedline on chip and the waveguide. Using this method, $Q_i$ of $2.7 \times 10^3$ and $Q_c$ of $3.5 \times 10^3$, are extracted. This serves as an upper bound to the resonator's internal resonator quality factor as the analysis does not formally correct for the radiative coupling losses between the device and the package enclosure and internal reflections in the metrology test set. This latter limitation can be removed through the use of existing metrology approaches.

In summary, the present invention is a sensitive instrument which characterizes the superconducting microstrip line through an efficient waveguide to microstrip line interface. Electro-magnetic wave theory can be used to analyze the operation of the invention. Electromagnetic wave from waveguide is converted to microstrip line via a waveguide septum. The dominant waveguide propagation mode $TE_{10}$ is transitioned to the quasi-TEM microstrip mode as the waveguide septum height is reduced and field confinement increased in a series of discrete steps. The impedance of the waveguide is designed to match with microstrip line impedance to provide maximum power transfer and minimal residual reflections. Microstrip line resonators are coupled to a microstrip feed line and serve as a device to characterize losses, kinetic inductance and dielectric constant through parameter extractions of a transmission line model.

The present invention includes a waveguide split-block fixture for thin-film circuit and material characterization at W-band frequencies. The present invention is applicable in a wet cryogen dewar, as well as cryo-cooled systems with appropriately defined thermal isolation. The present invention allows determination of the complex propagation constant of the test device. The present invention can also be readily used to improve the accuracy of non-superconducting transmission line characterization at cryogenic temperatures.

The present invention further includes the ability to measure thin-film superconducting loss with high resolution with an existing vector network analyzer and waveguide transmit/receive module. Since the peripherals, such as the network analyzer and cryogenic system used to cool the sample can be calibrated at high accuracy, the measurements obtained from the present invention can have high frequency resolution as well as high measurement dynamic range.

In the present invention, superconducting film phase velocity and dielectric loss measurements are demonstrated at millimeter wavelengths through the characterization of the transmission of half-wavelength niobium resonators in a reusable mounting fixture. Further, the present invention requires little to no maintenance.

In other advantages of the present invention, the ability to use the standard off-the-shelf mm-wave peripherals to characterize superconducting film with great degrees of accuracy, as well as use the minimum number of fabrication steps to create the superconducting film, is notable. However, no cryogenic detector is required and necessary as an integral element of the fabricated test samples.

The present invention can be designed and analyzed with good degrees of accuracy using electromagnetic simulation software. The superconducting film can be characterized based on the measurement curve fit of the transmission line model.

The present invention has commercial applications in low temperature thin-film superconductor characterizations. It can also be used as a compact waveguide probe for characterizing mm-wave devices. It may also have applications in mm-wave measurements of active or passive microstrip line devices with DC probing capability.

It should be emphasized that the above-described embodiments of the invention are merely possible examples of implementations set forth for a clear understanding of the principles of the invention. Variations and modifications may be made to the above-described embodiments of the invention without departing from the spirit and principles of the invention. All such modifications and variations are intended to be included herein within the scope of the invention and protected by the following claims.

What is claimed is:

1. A superconducting film device comprising:
   a superconducting microstrip device including:
      a silicon substrate disposed on a silicon handling wafer;
      a microstrip feed line; and
      a plurality of superconducting microstrip resonators and a half-wavelength resonator, disposed on said silicon substrate and coupled to said microstrip feed line;
      wherein said silicon substrate is a single-crystal silicon substrate of 50 µm in thickness.

2. The superconducting film device of claim 1, wherein said plurality of superconducting microstrip resonators are niobium titanium nitride (NbTiN) microstrip resonators, and said NbTiN microstrip resonators are 80, 40, and 20 µm in width, and respectively 550, 534 and 510 µm in length.

3. The superconducting film device of claim 2, wherein said half-wavelength resonator is a niobium (Nb) half-wavelength resonator, and said Nb resonator is 20 µm in width and 510 µm in length.

4. The superconducting film device of claim 3, wherein said silicon handling wafer has a thickness of 325 μm, a length of 6 mm, and a width of 1.5 mm.

5. The superconducting film device of claim 4, wherein said microstrip feedline is a niobium (Nb) microstrip feedline; and
wherein said NbTiN microstrip resonators and said Nb resonator, are each disposed 8 μm away from said Nb microstrip feed line.

6. A waveguide-to-microstrip line transition package for superconducting film characterization, comprising:
a superconducting microstrip device of claim 1; and
a fixture in which said microstrip device is disposed;
wherein said fixture comprises:
a plurality of blocks which form a waveguide housing, and which are used to align and secure said silicon handling wafer of said microstrip device to said fixture;
a waveguide septum made from a sheet; and
a plurality of direct current (DC) probes disposed adjacent to said waveguide septum, and which contact said microstrip device to provide at least DC bias; and
further wherein a thickness of said waveguide is 100 μm, and said waveguide septum is formed from gold-plated beryllium-copper (BeCu).

7. The package of claim 6, wherein said plurality of blocks is formed from copper, and said fixture further comprises:
a photonic choke milled onto a wall of said waveguide housing around and flanking said waveguide septum, and which defines a repeatable minimal-loss interface with high field confinement.

8. The package of claim 6, further comprising:
a spring disposed under said microstrip device, which presses said microstrip device against said waveguide septum.

9. The package of claim 6, further comprising:
a waveguide structure which accommodates two waveguides, each of said waveguides which are disposed in a port of said waveguide structure;
wherein each said port transmits and receives millimeter wave power into and out of said microstrip device contained in said fixture.

10. The package of claim 9, wherein said waveguide structure includes a plurality of stages, including a plurality of ridge-guides which convert said waveguide from a relatively larger width to a relatively smaller width, ending at said microstrip device; and
wherein said plurality of ridge-guides are implemented as said waveguide septum in said fixture.

11. The package of claim 10, wherein said septum is 100 μm in width, and a 26Ω characteristic impedance microstrip line width is 150 μm, allowing placement of said waveguide septum within a +/−25 μm alignment tolerance.

12. The package of claim 11, wherein a ground plane of said microstrip device is realized from 0.5 μm thick niobium (Nb).

13. The package of claim 6, wherein transmission of the package, as well as loss, is evaluated in the superconducting film through a quality factor (Q) measurement.

14. The package of claim 9, wherein said waveguides are formed of at least one of stainless steel or copper.

15. The package of claim 14, further comprising:
a cryogenic test apparatus in which said fixture and said waveguides are disposed, said test apparatus including:
a dewar containing liquid helium;
a shield which surrounds said microstrip device disposed in said fixture;
wherein said microstrip device in said fixture is connected to said liquid helium by a heat strap;
a helium gas purge line, which purges helium gas from said fixture;
a vacuum window, which seals room temperature ends of said waveguides;
wherein said ends of said waveguides are connected to millimeter wave extension modules via 10 dB couplers and 10 dB attenuators; and
a heater which prevents cooling of said vacuum window below dew point.

16. The package of claim 15, wherein said microstrip device is operated between 90 and 100 GHz, is used to measure quality factor and extract complex propagation properties to an accuracy of a few parts per thousand.

17. The package of claim 16, wherein said fixture is operated with a temperature range of from sub-kelvin to 320 K.

* * * * *